(12) United States Patent  
Liaw

(10) Patent No.: US 6,738,305 B1
(45) Date of Patent: May 18, 2004

(54) STANDBY MODE CIRCUIT DESIGN FOR SRAM STANDBY POWER REDUCTION

(75) Inventor: Jhon-Jhy Liaw, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/205,519

(22) Filed: Jul. 25, 2002

(51) Int. Cl.[7] ................................................. G11C 7/00
(52) U.S. Cl. .................. 365/229; 365/227; 365/189.09; 327/535; 327/537
(58) Field of Search ................................ 365/229, 227, 365/189.09; 327/535, 537

(56) References Cited

U.S. PATENT DOCUMENTS

| | | | |
|---|---|---|---|
| 5,541,885 A | 7/1996 | Takashima | 365/226 |
| 5,644,546 A * | 7/1997 | Furumochi et al. | 365/226 |
| 5,901,103 A * | 5/1999 | Harris et al. | 365/226 |
| 6,046,627 A | 4/2000 | Itoh et al. | 327/546 |
| 6,088,269 A | 7/2000 | Lambertson | 365/185.28 |
| 6,100,563 A * | 8/2000 | Arimoto | 257/347 |
| 6,294,404 B1 | 9/2001 | Sato | 438/106 |
| 6,344,992 B1 | 2/2002 | Nakamura | 365/154 |
| 2001/0028591 A1 * | 10/2001 | Yamauchi | 365/227 |

* cited by examiner

Primary Examiner—Michael S. Lebentritt
Assistant Examiner—Toan Le
(74) Attorney, Agent, or Firm—George O. Saile; Stephen B. Ackerman

(57) ABSTRACT

This invention provides a new standby mode circuit design which reduces the power dissipation of static random access memory, SRAM circuitry. The circuit and method of this invention provides a reduced power supply voltage to SRAM memory cells so as to reduce the power dissipation of memory cells, while utilizing the full power supply voltage for the SRAM bit line and peripheral circuitry so as to preserve memory access performance.

34 Claims, 2 Drawing Sheets

STANDBY MODE CIRCUIT DESIGN FOR SRAM STANDBY POWER REDUCTION

BACKGROUND OF THE INVENTION

1. Field of the Invention

This invention relates to a new standby mode circuit design to reduce the power dissipation of static random access memory, SRAM circuitry.

More particularly this invention relates to providing a reduced power supply voltage to SRAM memory cells so as to reduce the power dissipation of memory cells, while utilizing the full power supply voltage for the SRAM bit line and peripheral circuitry so as to preserve memory access performance.

2. Description of Related Art

As semiconductor integrated circuits become more dense and complex, the power consumption requirements are increasing dramatically. In addition, these dense integrated circuits include integrated static random access memory. In many applications, integrated circuits with SRAM must be operated using battery technology. The current available from batteries is limited. Therefore, there is a need to find ways to reduce the power consumption of all integrated circuits, especially memory. As portable, battery-operated circuit functions become more complex, they utilize more and more integrated memory. However, the circuit and memory design must operated at faster speeds. The design of high performance memory with reduced power consumption is an on-going area of invention in today's circuit technology.

U.S. Pat. No. 6,046,627 (ltoh, et al.) "Semiconductor Device Capable of Operating Stably with Reduced Power Consumption" describes a memory circuit device which allows reduced power dissipation via reduced substrate bias voltage, reduced power supply voltage and reduced threshold voltages.

U.S. Pat. No. 6,344,992 B1 (Nakamura) "SRAM Operating with a Reduced Power Dissipation" describes a SRAM design provides for reduced power dissipation by using circuitry which generates different voltage reference levels as a function of SRAM design and mode.

U.S. Pat. No. 6,294,404 (Sato) "Semiconductor Integrated Circuit Having Function of Reducing a Power Consumption and Semiconductor Integrated Circuit System Comprising this Semiconductor Integrated Circuit" discloses an SRAM circuit which creates a standby state which results in power reduction.

U.S. Pat. No. 6,088,269 (Lambertson) "Compact Page-Erasable EEPROM Non-Volatile Memory" discloses a page erasable memory which uses two layers of conductive or semiconductive material.

U.S. Pat. No. 5,541,885 (Takashima) "High Speed Memory with Low Standby Current" discloses a semiconductor memory device which consumes a very small amount of current during standby mode.

BRIEF SUMMARY OF THE INVENTION

It is the objective of this invention to provide a new standby mode circuit design to reduce the power dissipation of static random access memory, SRAM circuitry.

It is further an object of this invention to provide a reduced power supply voltage to SRAM memory cells so as to reduce the power dissipation of memory cells, while utilizing the full power supply voltage for the SRAM bit line and peripheral circuitry so as to preserve memory access performance.

The objects of this invention are achieved by a standby mode circuit for SRAM standby power reduction made up of an input stage whose input is a primary input control signal and whose output drives a mid-stage, a mid stage whose input comes from said input stage and whose output drives an output stage, and an output stage whose input comes from said mid-stage and whose output is the primary output of this standby power reduction circuit and which drives the Vcc node of an SRAM. The standby mode power reduction circuit contains two devices, a p-channel metal oxide semiconductor field effect transistor PMOS FET and an n-channel metal oxide semiconductor field effect transistor NMOS FET. The standby mode power reduction circuit input stage PMOS FET has its gate connected to a primary input control signal, its source connected to a power supply Vdd and its drain connected to a drain of the NMOS FET in the input stage, and connected to the input of the mid-stage. The standby mode power reduction circuit of the input stage has an NMOS FET which has its source connected to Vss or ground, its gate connected to the primary input control signal and its drain connected to the drain of the PMOS FET of the input stage and connected to the primary input of the mid-stage.

The standby node power reduction circuits mid-stage contains two devices, a p-channel metal oxide semiconductor field effect transistor PMOS FET and an n-channel metal oxide semiconductor field effect transistor NMOS FET. The standby node power reduction circuit's mid-stage PMOS FET has its gate connected to the output node from the input stage, has its source connected to a power supply Vdd and its drain connected to a drain of the NMOS FET in the mid-stage and this mid stage output node connected to the input of the output stage. The standby node power reduction circuit's mid-stage NMOS FET has its gate connected to the output node from the input stage, has its source connected to a power supply Vdd and its drain connected to the drain of the PMOS FET in the mid-stage and this mid-stage output node connected to the input of the output stage.

The standby node power reduction circuit's output stage contains two devices, a PMOS FET and an NMOS FET. The standby node power reduction circuit's output stage PMOS FET has its gate connected to the input stage output node, its source connected to the mid-stage output node and its drain connected to the output stage output node.

The standby node power reduction circuit's output stage NMOS FET has its gate and drain are both connected to the the Vdd power supply voltage, and its source is connected to the output stage output node.

The standby node power reduction circuit has a primary input control signal which selects either active node or standby node. The standby node power reduction circuit has a primary output which provides a lower Vcc node voltage to an SRAM during standby node in order to save power.

The standby node power reduction circuit has a primary output which provides the standard Vdd voltage to the SRAM during active mode and provides PMOS FET of the output stage provides a voltage, Vdd to the primary output node to the SRAM during active node. The standby node power reduction circuit's NMOS FET of the output stage provides a voltage reduced from Vdd by Vt to the SRAM where Vt equals NMOS threshold voltage. The standby node power reduction circuit's primary output provides a low Vcc (Vdd-Vt) where Vt is threshold of MOS FET during standby node, in order for save power dissipation. The standby node power reduction circuit's primary output provides reduced Vcc power for the memory cells during standby but maintain a full Vdd on SRAM periphery circuits and bit lines for field performance. The standby node power reduction circuit's primary output provides a full Vcc voltage level during active node.

DETAILED DESCRIPTION OF THE INVENTION

Figure 1:
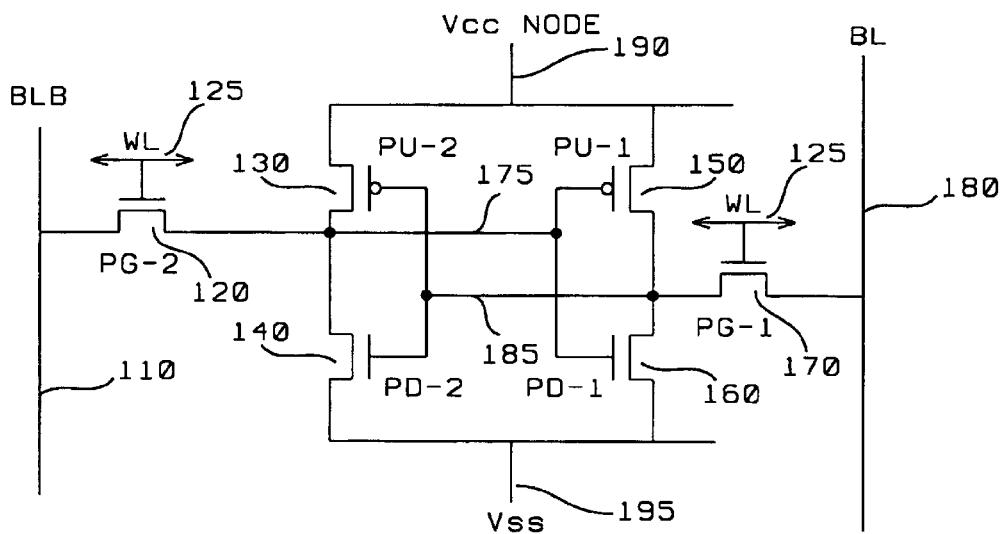
FIG. 1 shows an SRAM unit cell which utilizes the reduced supply voltage generated by the circuit of this invention.
Figure 2:
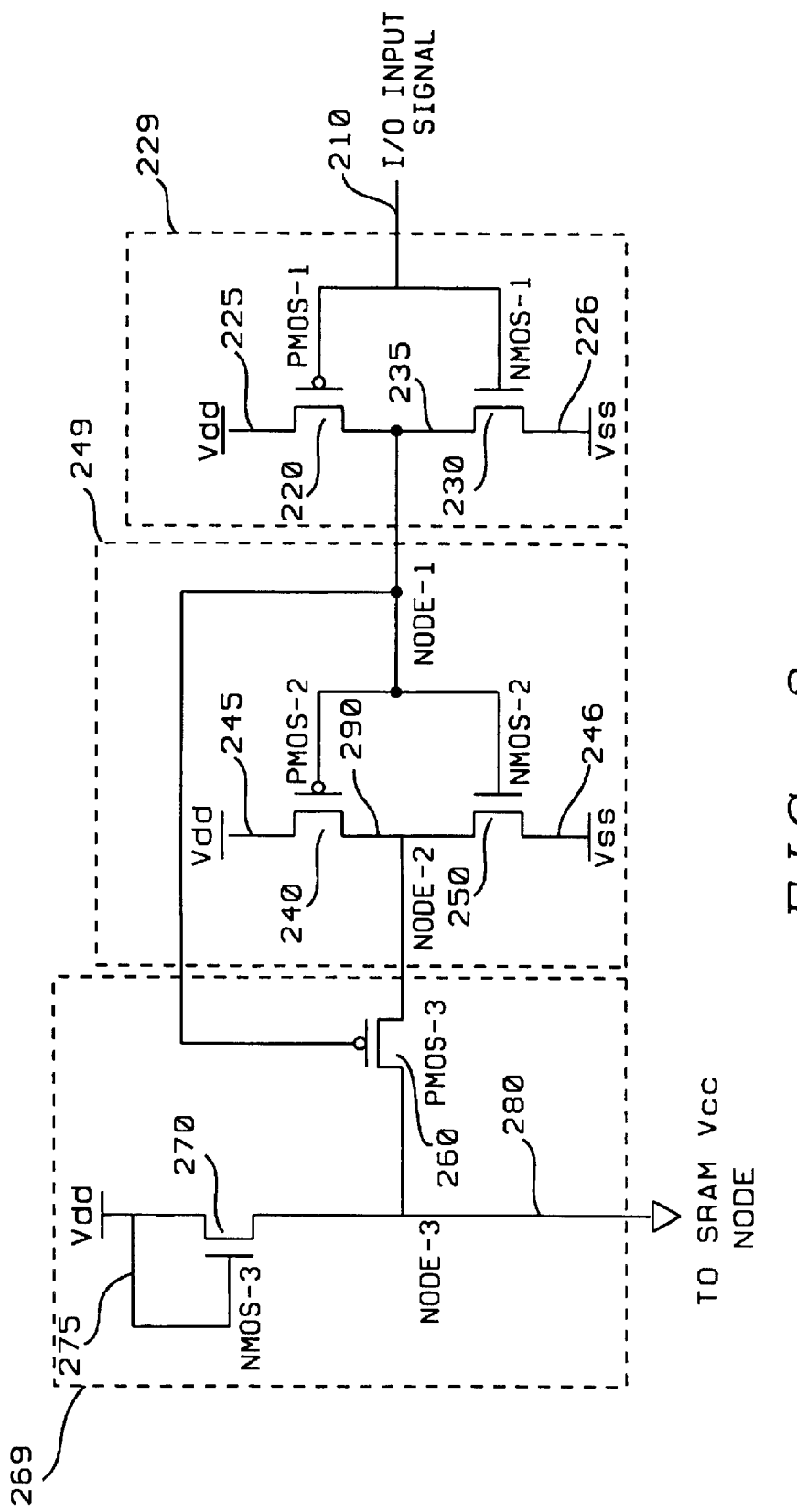
FIG. 2 shows the main circuit embodiment of this invention which generates a reduced supply voltage for SRAM memory cells.

FIG. 1 shows a typical SRAM unit cell whose standby power dissipation is regulated by the standby node circuit of this invention, which is shown in FIG. 2. In FIG. 1, the Vcc node 190 of the SRAM unit cell is connected to the standby circuit of the invention. The bit line 180 and its inverse BLB 110 are shown in FIG. 1. The word line of the SRAM array is shown 125. The word line 125 connects to N-channel metal oxide semiconductor field effect transistors NMOS FETS 120, 170. These are transfer gate devices. One leg of the memory cell latch contains PMOS FET pu-2 (130) whose drain is connected to the drain of NMOS FET DD-2 (140). The source of PMOS FET pu-2 130 is connected to the Vcc node 190. The source of NMOS FET PD-2 (140) is connected to Vss or ground 195. The gates of both NMOS FET PD-2 (140) and PMOS FET PU-2 (130) are connected together at node 185.

The other leg of the memory cell latch contains PMOS FET PU-1 (150) whose drain is connected to the drain of NMOS FET PD-1 (160). The source of NMOS FET PU-1 (150) is connected to the Vcc node 190. The source of NMOS FET PD-1 (160) is connected to Vss or ground 195. The gates of both NMOS FET PD-1 (160) and PMOS FET PU-1 (150) are connected together at node 175. Note that node 175 is also connected to the common drains of PMOS FET PU-2 (130) and NMOS FET PD-2 (140). Also, note that node 185 connects with the common drains of PMOS FET PU-1 (150) AND NMOS FET PD-1 (160).

FIG. 2 shows the standby node circuit of this invention. The primary input to the circuit of FIG. 2 is the control signal which selects between standby mode 'O' and active node ('I'). In the input stage 229 of this invention, this primary input drives the guts of both a PMOS FET (PMOS-1) 220 and an NMOS FET (NMOS-1) 230. The drain 235 of PMOS-1 220 is connected in common with the drain 235 of NMOS-1 230. The source of PMOS-1 220 is connected to the Vdd 225-power supply. The source of NMOS-1 230 is connected to Vss or ground 226. The common drain connection 235 forms the output of the input stage and becomes the input to the mid-stage 249 (node-1) 235.

In FIG. 2, node-1 235 drives the gates of both PMOS FET (PMOS-2) 240 and NMOS FET (NMOS-2) 250 of the mid-stage 249. The drain of PMOS-2 240 is connected in common with the drain of NMOS-2 250. The source of PMOS-2 is connected to the Vdd supply 245. The source of NMOS-2 250 is connected to Vss or ground 246. The common drain of PMOS-2 240 and NMOS-2 250 form a node, Node-2 290, which is the output of the mid-stage of this circuit of this invention. Node-2 290 is also the input to the output stage 269 of this circuit in FIG. 2.

In the output stage 269, the Node-2 signal drives the source of a PMOS FET transfer gate PMOS-3 260. The drain of this PMOS FET transfer gate 260 is connected to the output node, Node-3 280 of this output stage 269. The gate of PMOS-3 260 is driven by Node-1 235, which is the output of the input stage 229.

The output node, Node-3 has a load device, which is an NMOS FET NMOS-3 (270). The source of NMOS-3 270 is connected to Node-3 (280). The drain and gate of NMOS-3 270 are both connected to the Vdd power supply 275. Node-3 280 is the primary output of the standby circuit of this invention. This primary output, Node-3 280 goes to the Vcc node of the SRAM cell, which is shown in FIG. 1.

In the standby node, the I/O input signal in FIG. 2 is equal to 'O'. This will cause Node-1 235 to become a high voltage or a logical 'I', since the input stage circuit made up of PMOS-1 and NMOS-1 perform an inverter operation. When the gates of PMOS-1 220 and NMOS-230 are low, PMOS-1 220 will be 'ON' and NMOS-1 230 will be 'OFF'. This allows PMOS-1 220 to charge up Node-1 235 to a high voltage on 'I' level. This high voltage on the gates of PMOS-2 240 and NMOS-2 250 will cause NMOS-2 250 to turn ON and PMOS-2 240 to turn OFF. This allows NMOS-2 250 to discharge Node-2 290 to a low-level. Since Node-1 is high, transfer gate PMOS-3 260 will be off. This causes the Node-3 280 voltage to be determined by NMOS-3. The voltage at Node-3 280 will be Vdd-Vt where Vt is the NMOS-3 270-threshold voltage. Therefore, the SRAM Vcc voltage would equal Vdd-Vt in standby node to the Vcc node of the SRAM cell, which is shown in FIG. 1.

In the Active node, the I/O input signal in FIG. 2 is equal to '1'. This will cause Node-1 235 to become a low voltage or a 'O', since the input stage circuit made up of PMOS-1 (and NMOS-1 perform an inverter operation. When the gates of PMOS-1 220 and NMOS-1 230 are high, PMOS-1 220 will be 'OFF' and NMOS-1 230 will be 'ON'. This allows NMOS-1 230 to discharge Node-1 235 to a low voltage or 'O' level. This low voltage on the gates of PMOS-2 240 and NMOS-2 250 will cause NMOS-2 250 to turn off and PMOS-2 240 to turn ON. This allows NMOS-2 250 to discharge Node-2 290 to a high-level. Since Node-1 235 is low, transfer gate PMOS-3 260 will be ON. This causes the Node-3 280 voltage to be determined by PMOS-3 260. The voltage at Node-3 280 will be Vdd. Therefore, the SRAM Vcc voltage would equal Vdd in active mode.

The advantage of this invention is the ability to reduce the power dissipation of static random access memory, SRAM circuitry by delivering a reduced power supply voltage to SRAM memory cells. In addition, another advantage of this invention is to reduce the power dissipation of memory cells, while utilizing the full power supply voltage for the SRAM bit line and peripheral circuitry so as to preserve memory access performance.

While this invention has been particularly shown and described with Reference to the preferred embodiments thereof, it will be understood by those Skilled in the art that various changes in form and details may be made without Departing from the spirit and scope of this invention.

What is claimed is:

1. A standby mode circuit for SRAM standby power reduction comprising:
    an input stage whose input is a primary input control signal and whose output drives a mid-stage,
    a mid stage whose input comes from said input stage and whose output drives an output stage, and
    an output stage whose input comes from said mid-stage and whose output is the primary output of this standby power reduction circuit and which drives the Vcc node of an SRAM, wherein said input stage contains two devices, a p-channel metal oxide semiconductor field effect transistor, PMOS FET and an n-channel metal oxide semiconductor field effect transistor, NMOS FET.

2. The standby mode power reduction circuit of claim 1 wherein said input stage PMOS FET has its gate connected to said primary input control signal, its source connected to a power supply Vdd and its drain connected to a drain of said NMOS FET in said input stage, and connected to the input of said mid-stage.

3. The standby mode power reduction circuit of claim 1 wherein said input stage NMOS FET has its source connected to Vss or ground, its gate connected to said primary input control signal and its drain connected to said drain of said PMOS FET of said input stage and connected to said primary input of said mid-stage.

4. The standby node power reduction circuit of claim 1 wherein said mid-stage contains two devices, a p-channel metal oxide semiconductor field effect transistor PMOS FET and an n-channel metal oxide semiconductor field effect transistor NMOS FET.

5. The standby node power reduction circuit of claim 4 wherein said mid-stage PMOS FET has its gate connected to said output node from the input stage, has its source connected to a power supply Vdd and its drain connected to a drain of said NMOS FET in said mid-stage and this mid stage output node connected to the input of said output stage.

6. The standby node power reduction circuit of claim 4 wherein said mid-stage NMOS FET has its gate connected to said output node from the input stage, has its source connected to a power supply Vss and its drain connected to the drain of said PMOS FET in said mid-stage and this mid-stage output node connected to the input of said output stage.

7. The standby node power reduction circuit of claim 1 wherein said output stage contains two devices, a PMOS FET and an NMOS FET and whereby said output stage provides a reduced supply voltage to said SRAM during a standby period, and a full supply voltage during an active period.

8. The standby node power reduction circuit of claim 7 wherein said output stage PMOS FET has its gate connected to said input stage output node, its source connected to said mid-stage output node and its drain connected to said output stage output node.

9. The standby node power reduction circuit of claim 7 wherein said output stage NMOS FET has its gate and drain are both connected to the said Vdd power supply voltage, and its source is connected to said output stage output node.

10. The standby node power reduction circuit of claim 1 wherein said standby power reduction circuit has a primary input control signal which selects either active mode or standby mode.

11. The standby node power reduction circuit of claim 1 wherein said standby power reduction circuit has a primary output which provides a lower Vcc node voltage to said SRAM during standby mode in order to save power.

12. The standby node power reduction circuit of claim 1 wherein said standby power reduction circuit has said primary output which provide the standard Vdd voltage to said SRAM during active mode.

13. The standby node power reduction circuit of claim 1 wherein said PMOS FET of said output stage provides a voltage, Vdd to said primary output node to said SRAM during active mode.

14. The standby node power reduction circuit of claim 1 wherein said NMOS FET of said output stage provides a voltage reduced from Vdd by Vt to said SRAM where Vt equals NMOS threshold voltage.

15. The standby node power reduction circuit of claim 1 wherein said primary output provides a low Vcc (Vdd-Vt) where Vt is threshold of MOS FET during standby node, in order for save power dissipation.

16. The standby node power reduction circuit of claim 1 wherein said primary output provides reduced Vcc power for said memory cell during standby but maintain a full Vdd on SRAM periphery circuits and bit lines for optimum performance.

17. The standby node power reduction circuit of claim 1 wherein said primary output provides a full Vcc voltage level during active mode.

18. A method of producing a standby mode circuit for SRAM standby power reduction comprising the steps of:
including an input stage whose input is a primary input control signal and whose output drives a mid-stage,
including a mid stage whose input comes from said input stage and whose output drives an output stage, and
including an output stage whose input comes from said mid-stage and whose output is the primary output of this standby power reduction circuit and which drives the Vcc node of an SRAM, wherein said input stage contains two devices, an p-channel metal oxide semiconductor field effect transistor, PMOS FET, and an n-channel metal oxide semiconductor field effect transistor, NMOS FET.

19. The method of producing a standby mode power reduction circuit of claim 18 wherein said input stage PMOS FET has its gate connected to said primary input control signal, its source connected to a power supply Vdd and its drain connected to a drain of said NMOS FET in said input stage, and connected to the input of said mid-stage.

20. The method of producing a standby mode power reduction circuit of claim 18 wherein said input stage NMOS FET has its source connected to Vss or ground, its gate connected to said primary input control signal and its drain connected to said drain of said PMOS FET of said input stage and connected to said primary input of said mid-stage.

21. The method of producing a standby node power reduction circuit of claim 18 wherein said mid-stage contains two devices, a p-channel metal oxide semiconductor field effect transistor PMOS FET and an n-channel metal oxide semiconductor field effect transistor NMOS FET.

22. The method of producing a standby node power reduction circuit of claim 21 wherein said mid-stage PMOS FET has its gate connected to said output node from the input stage, has its source connected to a power supply Vdd and its drain connected to a drain of said NMOS FET in said mid-stage and this mid stage output node connected to the input of said output stage.

23. The method of producing a standby node power reduction circuit of claim 21 wherein said mid-stage NMOS FET has its gate connected to said output node from the input stage has its source connected to a power supply Vss and its drain connected to the drain of said PMOS FET in said mid-stage and this mid-stage output node connected to the input of said output stage.

24. The method of producing a standby node power reduction circuit of claim 18 wherein said output stage contains two devices, a PMOS FET and an NMOS FET and whereby said output stage provides a reduced supply voltage to said SRAM during a standby period, and a full supply voltage during an active period.

25. The method of producing a standby node power reduction circuit of claim 24 wherein said output stage PMOS FET has its gate connected to said input stage output node, its source connected to said mid-stage output node and its drain connected to said output stage output node.

26. The method of producing a standby node power reduction circuit of claim 24 wherein said output stage NMOS FET has its gate and drain are both connected to the said Vdd power supply voltage, and its source is connected to said output stage output node.

27. The method of producing a standby node power reduction circuit of claim 18 wherein said standby power reduction circuit has a primary input control signal which selects either active mode or standby mode.

28. The method of producing a standby node power reduction circuit of claim 18 wherein said standby power reduction circuit has a primary output which provides a lower Vcc node voltage to said SRAM during standby node in order to save power.

29. The method of producing a standby node power reduction circuit of claim 18 wherein said standby power reduction circuit has said primary output which provide the standard Vdd voltage to said SRAM during active mode.

30. The method of producing a standby node power reduction circuit of claim 18 wherein said PMOS FET of said output stage provides a voltage, Vdd to said primary output node to said SRAM during active mode.

31. The method of producing a standby node power reduction circuit of claim 18 wherein said NMOS FET of said output stage provides a voltage reduced from Vdd by Vt to said SRAM where Vt equals NMOS threshold voltage.

32. The method of producing a standby node power reduction circuit of claim 18 wherein said primary output provides a low Vcc (Vdd-Vt) where Vt is threshold of MOS FET during standby node, in order for save power dissipation.

33. The method of producing a standby node power reduction circuit of claim 18 wherein said primary output provides reduced Vcc power for said memory cell during standby but maintain a full Vdd on SRAM periphery circuits and bit lines for optimum performance.

34. The standby node power reduction circuit of claim 18 wherein said primary output provides a full cc voltage level during active mode.

* * * * *